US011380863B2

United States Patent
Zehnder et al.

(10) Patent No.: US 11,380,863 B2
(45) Date of Patent: Jul. 5, 2022

(54) FLEXIBLE ELECTROLUMINESCENT DEVICES

(71) Applicant: Nanosys, Inc., Milpitas, CA (US)

(72) Inventors: Donald A. Zehnder, San Carlos, CA (US); Dylan C. Hamilton, Oakland, CA (US); Ruiqing Ma, Morristown, NJ (US); Jesse R. Manders, Mountain View, CA (US)

(73) Assignee: Nanosys, Inc., Milpitas, CA (US)

( * ) Notice: Subject to any disclaimer, the term of this patent is extended or adjusted under 35 U.S.C. 154(b) by 0 days.

(21) Appl. No.: 16/822,931

(22) Filed: Mar. 18, 2020

(65) Prior Publication Data

US 2020/0303668 A1  Sep. 24, 2020

Related U.S. Application Data

(60) Provisional application No. 62/820,489, filed on Mar. 19, 2019.

(51) Int. Cl.
| | |
|---|---|
| *H01L 51/00* | (2006.01) |
| *H01L 51/50* | (2006.01) |
| *H01L 51/52* | (2006.01) |
| *H01L 33/04* | (2010.01) |
| *H01L 33/06* | (2010.01) |

(Continued)

(52) U.S. Cl.
CPC ........ *H01L 51/502* (2013.01); *H01L 51/5036* (2013.01); *H01L 51/5218* (2013.01); *H01L 51/5253* (2013.01); *H01L 51/56* (2013.01); *H01L 27/3211* (2013.01); *H01L 33/04* (2013.01); *H01L 33/06* (2013.01); *H01L 33/44* (2013.01); *H01L 51/0097* (2013.01); *H01L 51/5056* (2013.01); *H01L 51/5072* (2013.01); *H01L 51/5092* (2013.01); *H01L 51/5234* (2013.01); *H01L 2251/5338* (2013.01)

(58) Field of Classification Search
CPC .............. H01L 51/502; H01L 51/5036; H01L 51/5218; H01L 51/5253; H01L 51/5056; H01L 51/5072; H01L 51/5092; H01L 51/5234; H01L 51/0097; H01L 2251/5338; H01L 33/04; H01L 33/06; H01L 33/44; H01L 27/3211

See application file for complete search history.

(56) References Cited

U.S. PATENT DOCUMENTS 8,963,193 B2 *  2/2015  Hermes ............... H01L 51/5221
257/99
9,312,266 B2 *  4/2016  Tang ................. H01L 27/11578
(Continued)

*Primary Examiner* — Ida M Soward
(74) *Attorney, Agent, or Firm* — Sterne, Kessler, Goldstein & Fox P.L.L.C.

(57) ABSTRACT

Embodiments of a flexible electroluminescent (EL) device are described. An EL device includes a device stack and a flexible substrate configured to support the device stack. The device stack can include a anode and a cathode, a quantum dot (QD) film positioned between the anode and the cathode and configured to produce light having a first peak wavelength. The device stack further includes a patterned insulating layer disposed on the anode and configured to form electrically active regions in the device stack and to control emission of the light from the EL device through the electrically active regions. The EL device further includes an encapsulation layer disposed on the cathode.

20 Claims, 7 Drawing Sheets

(51) Int. Cl.
    *H01L 33/44*         (2010.01)
    *H01L 27/32*         (2006.01)
    *H01L 51/56*         (2006.01)

(56) References Cited

U.S. PATENT DOCUMENTS

| | | | |
|---|---|---|---|
| 9,318,663 B2* | 4/2016 | Tsai | H01L 33/20 |
| 10,283,572 B2* | 5/2019 | Lee | H01L 27/322 |
| 10,903,284 B2* | 1/2021 | Lee | G06F 3/0445 |
| 2009/0173933 A1* | 7/2009 | Maa | H01L 31/035254 |
| | | | 257/19 |
| 2012/0080087 A1* | 4/2012 | Denby | H01L 31/03529 |
| | | | 136/256 |
| 2016/0035924 A1* | 2/2016 | Oraw | H01L 31/0508 |
| | | | 257/89 |
| 2018/0102442 A1* | 4/2018 | Wang | H01L 31/02 |
| 2018/0348574 A1* | 12/2018 | Lin | G06V 10/143 |
| 2018/0364521 A1* | 12/2018 | Baek | G02F 1/133528 |
| 2019/0064603 A1* | 2/2019 | Lee | G02B 6/0091 |
| 2019/0348623 A1* | 11/2019 | Dohner | H01B 1/08 |
| 2020/0168673 A1* | 5/2020 | Manders | H01L 51/5206 |

\* cited by examiner

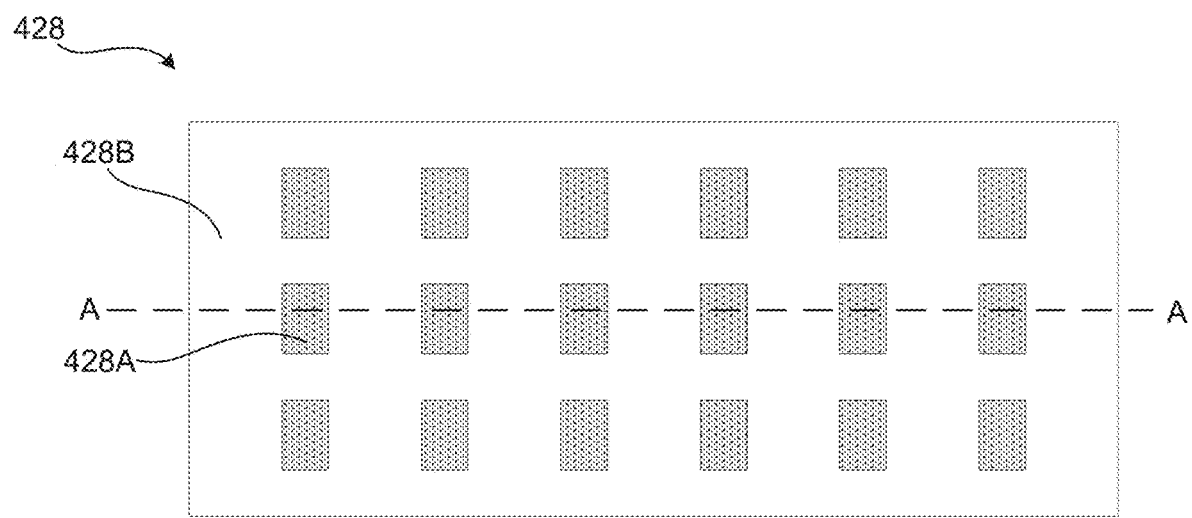
FIG. 5
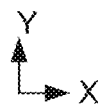

FLEXIBLE ELECTROLUMINESCENT DEVICES

CROSS REFERENCE TO RELATED APPLICATIONS

This application incorporates by reference in their entirety U.S. Provisional Appl. No. 62/820,489, filed Mar. 19, 2019.

BACKGROUND OF THE INVENTION

Field

The present invention relates to electroluminescent devices (e.g., light emitting diodes (LEDs)) having nanostructure (e.g., quantum dot (QD) based emission layers on flexible substrates.

Background

Electroluminescent (EL) devices are typically used to generate images on display devices such as phones, tablets, monitors, televisions, or digital billboards. With increase in demand for portable display devices, EL devices (e.g., organic LEDs or QD-LEDs) have been made on flexible substrates to produce flexible display devices, which can be curved or rolled without causing structural and functional damage to the display devices.

However, one of the challenges is encapsulating the flexible EL devices to provide them with mechanical and/or environmental protection (e.g., protection from moisture and/or contaminants) to achieve similar or longer operational lifetime and efficiency compared to the non-flexible EL devices. Another challenge is manufacturing and encapsulating the flexible EL devices at low costs with simple processing technologies for ease of mass production.

SUMMARY

Accordingly, there is need for inexpensive processing methods for fabricating flexible EL devices with effective encapsulation against moisture and/or contaminants. The present disclosure provides example flexible EL devices with luminescent nanostructure (NS)-based emission layers (EMLs) and example inexpensive methods for fabricating the same. In some embodiments, the luminescent NSs can have barrier coatings configured to provide the EMLs with encapsulation against moisture and/or contaminants. As such, the example flexible EL devices does not have to be encapsulated with barrier materials having very low water vapor transmission rate (WVTR) (e.g., less than $10^{-5}$ g/m²-day), which can require complicated and/or expensive encapsulation processes. The example flexible EL devices can be encapsulated with inexpensive barrier materials having relatively high WVTR (e.g., $10^{-5}$ g/m²-day, $10^{-5}$ g/m²-day, $10^{-3}$ g/m²-day, $10^{-2}$ g/m²-day, or $10^{-1}$ g/m²-day) using simple encapsulation processes, and consequently, reducing the manufacturing cost and facilitating mass production According to an embodiment, an EL device includes a device stack and a flexible substrate configured to support the device stack. The device stack can include a anode and a cathode, a QD film positioned between the anode and the cathode and configured to produce light having a first peak wavelength. The device stack further includes a patterned insulating layer disposed on the anode and configured to form electrically active regions in the device stack and to control emission of the light from the EL device through the electrically active regions. The EL device further includes an encapsulation layer disposed on the cathode.

According to an embodiment, a method of fabricating an EL device includes providing a flexible substrate with a pre-deposited layer of anode, forming a patterned insulating layer on the pre-deposited layer of anode, forming a QD film on the patterned insulating layer, forming a cathode on the QD film, and forming an encapsulation layer on the cathode.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present embodiments disclosed herein and, together with the description, further serve to explain the principles of the present embodiments and to enable a person skilled in the relevant art(s) to make and use the present embodiments.

FIG. 5 is a schematic of a top view of the color processing layer of the flexible EL device of FIG. 4, according to some embodiment.

Figure 1:
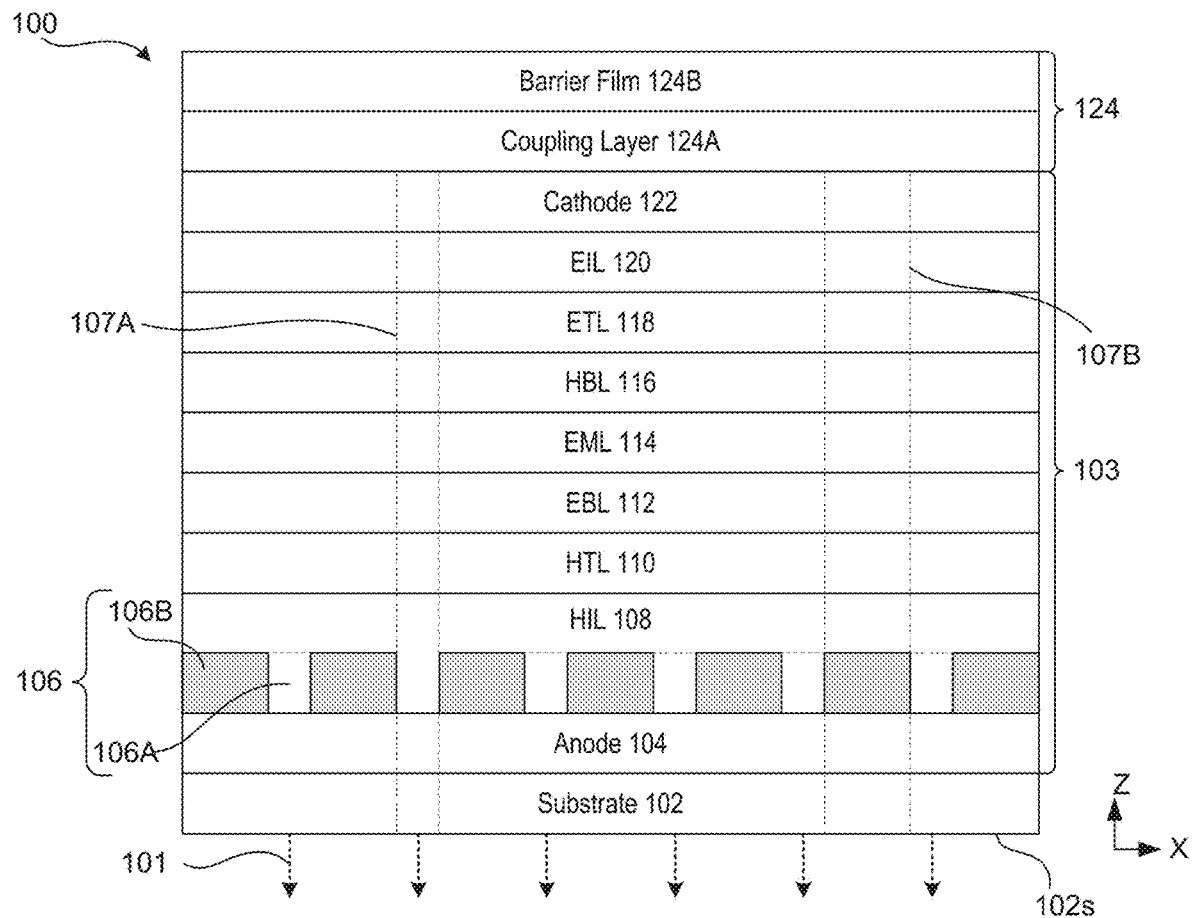
FIG. 1 is a schematic of a cross-sectional view of a flexible electroluminescent (EL) device with an encapsulation layer, according to some embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements unless mentioned otherwise. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein. It should be appreciated that the particular implementations shown and described herein are examples and are not intended to otherwise limit the scope of the application in any way.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

In embodiments, the term "display device" refers to an arrangement of elements that allow for the visible representation of data on a display screen. Suitable display screens can include various flat, curved or otherwise-shaped screens, films, sheets or other structures for displaying information visually to a user. Display devices described herein can be included in, for example, display systems encompassing a liquid crystal display (LCD), televisions, computers, monitors, mobile phones, smart phones, personal digital assistants (PDAs), gaming devices, electronic reading devices, digital cameras, tablets, wearable devices, car navigation systems, digital signage, augmented reality, virtual reality, and the like.

The term "about" as used herein indicates the value of a given quantity varies by ±10% of the value. For example, "about 100 nm" encompasses a range of sizes from 90 nm to 110 nm, inclusive.

The term "substantially" as used herein indicates the value of a given quantity varies by ±1% to ±5% of the value.

In embodiments, the term "optically coupled" means that components are positioned such that light is able to pass from one component to another component without substantial interference.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell can contain non-crystalline regions and can even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (QY) as used herein refers to the ratio of photons emitted to photons absorbed, e.g., by a nanostructure or population of nanostructures. As known in the art, quantum yield is typically determined by a comparative method using well-characterized standard samples with known quantum yield values.

The term "primary emission peak wavelength" as used herein refers to the wavelength at which the emission spectrum exhibits the highest intensity.

The term "full width at half-maximum" (FWHM) as used herein refers to refers to a measure of spectral width. In the case of an emission spectrum, a FWHM can refer to a width of the emission spectrum at half of a peak intensity value.

The term Forster radius used herein is also referred as Forster distance in the art.

The term "nanostructure (NS) film" is used herein to refer to a film having luminescent nanostructures.

The term "flexible" is used herein to refer to an element that is capable of being bent, twisted, folded, rolled into a tubular form, compressed, or similarly manipulated without structural and/or functional damage to the element.

The term "red wavelength region" is used herein to refer to a wavelength region of the visible spectrum that can include wavelengths ranging from about 620 nm to about 750 nm, according to some embodiments.

The term "green wavelength region" is used herein to refer to a wavelength region of the visible spectrum that can include wavelengths ranging from about 495 nm to about 570 nm, according to some embodiments.

The term "blue wavelength region" is used herein to refer to a wavelength region of the visible spectrum that can include wavelengths ranging from about 435 nm to about 495 nm, according to some embodiments.

The published patents, patent applications, websites, company names, and scientific literature referred to herein are hereby incorporated by reference in their entirety to the same extent as if each was specifically and individually indicated to be incorporated by reference. Any conflict between any reference cited herein and the specific teachings of this specification shall be resolved in favor of the latter. Likewise, any conflict between an art-understood definition of a word or phrase and a definition of the word or phrase as specifically taught in this specification shall be resolved in favor of the latter.

Technical and scientific terms used herein have the meaning commonly understood by one of skill in the art to which the present application pertains, unless otherwise defined. Reference is made herein to various methodologies and materials known to those of skill in the art.

Example Embodiments of Flexible Electroluminescent Devices

FIG. 1 illustrates a schematic of a cross-sectional view of a flexible electroluminescent (EL) device 100, according to an embodiment. In some embodiments, EL device 100 can be configured to generate images on a flexible display device and/or to provide flexible light sources for applications in biosensors, medical devices (e.g., phototherapy tools), or other EL device-based flexible devices. The term "flexible" is used herein to refer to an element that is capable of being bent, twisted, folded, rolled into a tubular form, compressed, or similarly manipulated without structural and/or functional damage to the element.

In some embodiments, EL device 100 can include a substrate 102, a device stack 103, and an encapsulation layer 124. Substrate 102 can be configured to support device stack 103 and optionally to support a control circuitry (not shown) for controlling operation of device stack 103. In some embodiments, substrate 102 can be flexible and optically transparent to allow light 101 generated by device stack 103 to be emitted through substrate 102 without substantially absorbing light 101. Light 101 emitted from device stack is represented in FIG. 1 by black arrows pointing towards −Z-direction. In some embodiments, substrate 102 can include a polymeric material, such as plastic, polyethylene terephthalate (PET), or other suitable flexible polymeric materials. In some embodiments, substrate 102 can include ultrathin silver, silver mesh, silver nanowires, conductive organic polymer, or other suitable conductive materials that does not include indium-tin-oxide (ITO). In some embodiments, substrate 102 can have a vertical dimension (e.g., thickness) along a Z-axis ranging from about 10 μm to about 150 μm (e.g., about 10 μm, about 12 μm, about 25 μm, about 75 μm, about 100 μm, about 125, μm or about 150 μm). In some embodiments, surface 102s of substrate 102 can serve as a screen to display images generated using light 101. In some embodiments, substrate 102 can serve as an encapsulation layer to provide environmental protection to EL device 100. The materials of substrate 102 can be selected to have barrier properties, such as a water vapor transmission rate (WVTR) ranging from about $10^{-5}$ $g/m^2$-day to about 10 $g/m^2$-day (e.g., about $10^{-5}$ $g/m^2$-day, about $10^{-4}$ $g/m^2$-day, about $10^{-3}$ $g/m^2$-day, about $10^{-2}$ $g/m^2$-day, or about $10^{-1}$ $g/m^2$-day).

Device stack 103 can include an anode 104, a patterned insulating layer 106 disposed on anode 104, a hole injection layer (HIL) 108 disposed on insulating layer 106, a hole transport layer (HTL) 110 on HIL 108, an electron blocking layer (EBL) 112 disposed on HTL 110, an emission layer (EML) 114 disposed on EBL 112, a hole blocking layer (HBL) 116 disposed on EML 114, an electron transport layer (ETL) 118 disposed on HBL 116, an electron injection layer (EIL) 120 disposed on ETL 118, and a cathode 122 disposed on EIL 120, according to some embodiments. In some embodiments, device stack 103 can include anode 104, patterned insulating layer 106, HTL on patterned insulating layer 106, emission layer (EML) 114 disposed on HTL 110, and cathode 122 disposed on EML 114, without HIL 108, EBL 112, HBL 116, ETL 118, or EIL 120. In some embodiments, device stack 103 can include anode 104, patterned insulating layer 106, emission layer (EML) 114 disposed on patterned insulating layer 106, and cathode 122 disposed on EML 114, without HIL 108, HTL 110, EBL 112, HBL 116, ETL 118, or EIL 120.

EL device 100 can be configured to emit red, green, or blue light 101 based on the composition of EML 114. In some embodiments, EML 114 can include one or more NS-based light emitting layers, or a combination of NS-based and organic light emitting layers. In some embodiments, the NS-based light emitting layer (e.g., NS film 800 described with reference to FIG. 8) can include luminescent NSs such as QDs (e.g., NS 700 described with reference to FIG. 17). The organic material of the organic light emitting layer or the size and material of NSs of the NS-based light emitting layer in EML 114 can be selected based on the desired color (e.g., red, green, or blue) of light 101 emitted through substrate 102.

In some embodiments, the organic material of the organic light emitting layer or the size and material of NSs of the NS-based light emitting layer in EML 114 can be selected to emit light 101 having a primary emission peak wavelength in the red wavelength region (e.g., wavelengths ranging from about 620 nm to about 750 nm) of the visible spectrum. In some embodiments, the organic material of the organic light emitting layer or the size and material of NSs of the NS-based light emitting layer in EML 114 can be selected to emit light 101 having a primary emission peak wavelength in the green wavelength region (e.g., wavelengths ranging from about 495 nm to about 570 nm) of the visible spectrum. In some embodiments, the organic material of the organic light emitting layer or the size and material of NSs of the NS-based light emitting layer in EML 114 can be selected to emit light 101 having a primary emission peak wavelength in the blue wavelength region (e.g., wavelengths ranging from about 435 nm to about 495 nm) of the visible spectrum. In some embodiments, the organic material of the organic light emitting layer or the size and material of NSs of the NS-based light emitting layer in EML 114 can be selected to emit light 101 having a primary emission peak wavelength in the visible spectrum (e.g., wavelengths ranging from about 435 nm to about 750 nm). In some embodiments, EML 114 can have a population of luminescent NSs configured to emit red light, a population of luminescent NSs configured to emit green light, a population of luminescent NSs configured to emit blue light, a population of luminescent NSs configured to emit red and green light, a population of luminescent NSs configured to emit red, green, and blue light, or a population of luminescent NSs configured to emit any colored light in the visible spectrum.

The red, green, and/or blue light 101 can be generated from EML 114 and emitted from EL device 100 when a voltage is applied across device stack 103 during operation. The red, green, and/or blue light 101 can be generated when the voltage is applied because electrons and holes recombine in EML 114 to release photons corresponding to wavelengths in the red, green, and/or blue wavelength region, respectively, of the visible spectrum. The electrons and holes can be injected from cathode 122 and anode 104, respectively, when the voltage is applied such that anode 104 is positive with respect to cathode 122. In some embodiments, EML 114 can be formed on underlying layer by, for example, spin coating, inkjet printing, slot die coating, nozzle printing, contact printing, a suitable solution printing technology, thermal evaporation, or a suitable vapor deposition technology. In some embodiments, EML 114 can include indium phosphide (InP) based QDs having a diameter ranging from about 3 nm to about 25 nm (e.g., about 5 nm, about 10 nm, or about 15 nm) and configured to emit a primary emission peak wavelength in the red wavelength region, the green wavelength region, and/or between the red and green wavelength regions.

Anode 104 can be configured to inject holes to device stack 103 when positively biased during operation, as discussed above. Anode 104 can include electrically conductive and optically transparent materials such as, for example, indium-tin-oxide (ITO), according to some embodiments. In some embodiments, anode 104 can be formed on substrate 102 by depositing and patterning the electrically conductive and optically transparent materials on substrate 102. The deposition can be performed by, for example, sputtering, thermal evaporation, or a suitable method for depositing electrically conductive and optically transparent materials. The patterning can be performed by, for example, a lithography process or a masking process during the deposition. In some embodiments, anode 104 can have a vertical dimension (e.g., thickness) along a Z-axis ranging from about 50 nm to about 150 nm (e.g., about 50 nm, about 80 nm, about 100 nm, about 120 nm, about 125 nm, about 140 nm, or about 150 nm). In some alternate embodiments, anode 104 can include optically reflective materials such as, for example, aluminum (Al) or silver (Ag) when device stack 103 is configured to emit light 101 through cathode 122 instead of through substrate 102 as shown in FIG. 1.

Patterned insulating layer 106 can include patterned regions 106A and unpatterned regions 106B. Patterned regions 106A can be openings in patterned insulating layer 106 and can be arranged in an array as shown in the top view of patterned insulating layer 106 in FIG. 2. The cross-sectional view of patterned insulating layer 106 in FIG. 1 can be along line A-A of FIG. 2. In some embodiments, current flow paths between anode 104 and cathode 122 can be provided through the openings of patterned regions 106A, and as a result, electrically active regions 107A can be formed in EL device 100. Whereas, current flow between anode 104 and cathode 122 can be blocked through unpatterned regions 106B, and as a result, electrically inactive regions 107B can be formed in EL device 100. As such, patterned insulating layer 106 can be configured to control the emission of light 101 through active regions 107A and generate images on surface 102s or a display screen (not shown) coupled to surface 102s based on emitted light 101. Based on the desired image to be generated and displayed, patterned regions 106A can be strategically arranged on patterned insulating layer 106 to emit light 101 from selective regions of substrate 102. These selective regions can correspond to patterned regions 106A.

Figure 2:
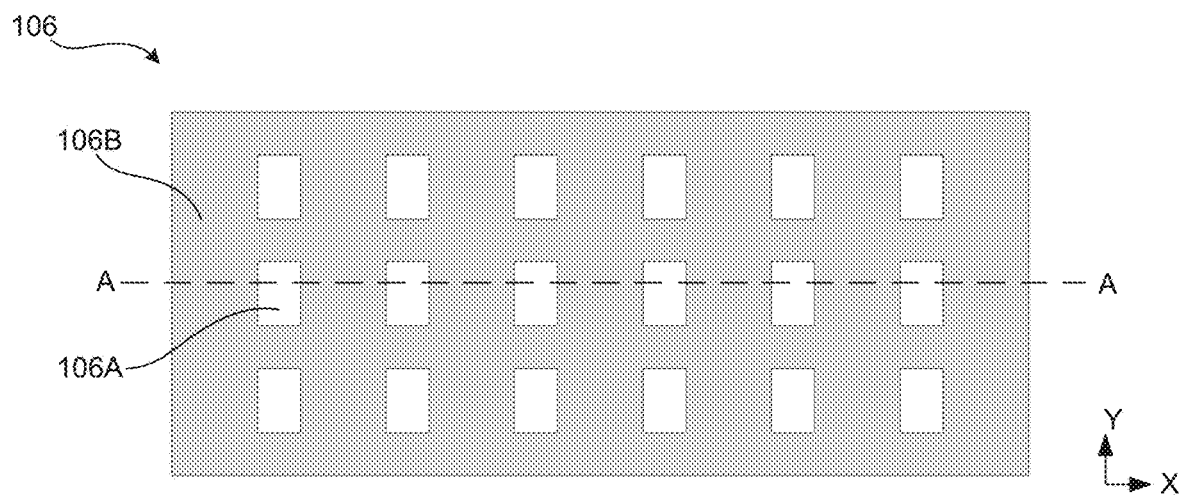
FIG. 2 is a schematic of a top view of an insulating layer of the flexible EL device of FIG. 1, according to some embodiment.

In some embodiments, patterned regions 106A can be any geometric shape (e.g., circular, triangular, elliptical, or trapezoidal) and is not limited to the rectangular shape shown in FIG. 2. In some embodiments, patterned regions 106A can be arranged in any pattern and is not limited to the arrangement shown in FIG. 2. Patterned insulating layer 106 can be disposed between other layers of device stack 103 and is not limited to being disposed between anode 104 and HIL 108, according to some embodiments.

In some embodiments, patterned insulating layer 106 can have a vertical dimension (e.g., thickness) along a Z-axis ranging from about 50 nm to about 50 µm (e.g., about 50 nm, about 100 nm, about 500 nm, about 750 nm, about 1 µm, about 10 µm, about 25 µm, or about 50 µm). In some embodiments patterned insulating layer 106 can include an insulating material, such as epoxy (e.g., SU-8 epoxy) or photoresist materials. The insulating layer can be optically transparent, reflective, or opaque and can be any color, such as black.

In some embodiments, patterned insulating layer 106 can be formed on anode 104 by depositing and patterning the insulating material on anode 104 using inexpensive deposition and/or patterning techniques. The deposition can be performed by, for example, spin coating, inkjet printing, slot die coating, nozzle printing, contact printing, or a suitable solution deposition technology for depositing insulating materials. The patterning can be performed by, for example, a lithography process or a masking process during the deposition. The mask used for lithography can be a low-cost ink-jet printed ink on a transparent film. In some embodiments, the patterning can be performed using laser to form the openings in patterned regions 106A. In some embodiments, half-tone printing technique can be used to form patterned insulating layer 106 on anode 104. In some embodiments, a pre-cut or pre-patterned insulating film with patterned regions 106A can be deposited on anode 104 to form patterned insulating layer 106 in an inexpensive process. The pre-cut insulating film can be self-adhesive and its patterned regions 106A can be formed by die cutting or laser cutting.

Referring to FIG. 1, optionally HIL 108 can be formed partly on unpatterned regions 108B of patterned insulating layer 106 and partly on portions of anode 104 exposed through patterned regions 106A of patterned insulting layer 106. In some embodiments, HIL 108 can be deposited within patterned regions 106A on anode 104 and not on unpatterned regions 106B (not illustrated in FIG. 1). HIL 108 can be configured to facilitate the injection of holes from anode 104 into HTL 110. In some embodiments, HIL 108 can have a vertical dimension (e.g., thickness) along a Z-axis ranging from about 3 nm to about 70 nm (e.g., about 3 nm, about 10 nm, about 30 nm, about 40 nm, about 50 nm, about 60 nm, or about 70 nm). In some embodiments, the vertical dimension of HIL 108 is equal to the vertical dimensions of patterned regions 106A such that HIL 108 can at least fill the openings in patterned regions 106A.

In some embodiments, HIL 108 can include p- or n-type, organic or inorganic semiconductor materials such as, for example, metal oxides (e.g., nickel oxide (NiO), molybdenum oxide ($MoO_3$), vanadium oxide ($V_2O_5$), tungsten oxide ($WO_3$)), polyanilines, polythiophenes (e.g., poly(3,4-ethylenedioxythiophene) (PEDOT) doped with poly(styrene sulfonate) (PSS)), Tris[phenyl(m-tolyl)amino]triphenylamine (mTDATA), or hexaazatriphenylene-hexacarbonitrile (HAT-CN). HIL 108 can be deposited on insulating layer 106 and anode 104 by, for example, spin coating, inkjet printing, slot die coating, nozzle printing, contact printing, a suitable solution printing technology, roll-to-roll processing, thermal evaporation, or a suitable vapor deposition technology.

In some embodiments, HTL 110 can be formed on HIL 108 as shown in FIG. 1 or on patterned insulating layer 106 if HIL 108 is optionally not included. In some embodiments, HTL 110 can be partly formed on unpatterned regions 106B and partly on HIL 108 when HIL 108 is formed only within patterned regions 106A (not shown in FIG. 1). HTL 110 can be configured to facilitate the transportation of holes from HIL 108 to EML 114. In some embodiments, HTL 110 can have a vertical dimension (e.g., thickness) along a Z-axis smaller than the vertical dimension of HIL 108 and can range from about 10 nm to about 30 nm (e.g., about 10 nm, about 20 nm, or about 30 nm).

In some embodiments, HTL 110 can include p-type, organic or inorganic semiconductor materials such as, for example, metal oxides or nanostructures of metal oxides (e.g., nickel oxide (NiO), molybdenum oxide ($MoO_3$), vanadium oxide ($V_2O_5$), or tungsten oxide ($WO_3$)), or polymers (e.g., poly(N-vinylcarbazole), poly(triarylamines), triphenylamine derivatives, or carbazole derivatives), or small organic molecules (e.g. N,N-Di(1-naphthyl)-N,N-diphenyl-(1,1-biphenyl)-4,4-diamine (NPB)). In some embodiments, HTL 110 and HIL 108 can include material similar or different from each other. In some embodiments, HTL 110 can be deposited on HIL 108 by, for example, spin coating, inkjet printing, slot die coating, nozzle printing, contact printing, a suitable solution printing technology, roll-to-roll processing, thermal evaporation, or a suitable vapor deposition technology.

Optionally, EBL 112 can be formed on HTL 110 as an intervening layer between EML 114 and HTL 110. EBL 112 can be configured to block electrons from escaping EML 114 by acting as a large energy barrier between HTL 110 and EML 114. EBL 112 can include p-type semiconductor materials that have a shallow conduction band, such as, for example, carbazole and triphenylene based organic compounds. In some embodiments, EBL 112 can be deposited on HTL 110 by, for example, spin coating, inkjet printing, slot die coating, nozzle printing, contact printing, a suitable solution printing technology, thermal evaporation, or a suitable vapor deposition technology.

Similar to EBL 112, HBL 116 can be optionally formed on EML 114 as an intervening layer between EML 114 and ETL 118. HBL 116 can be configured to block holes from escaping EML 114 by acting as a large energy barrier between ETL 118 and EML 114. HBL 116 can include n-type semiconductor materials that have a deep valence band, such as, for example, substituted benzimidazoles organic compounds. In some embodiments, HBL 116 can formed by, for example, spin coating, inkjet printing, slot die coating, nozzle printing, contact printing, a suitable solution printing technology, thermal evaporation, or a suitable vapor deposition technology.

Optionally, ETL 118 can be formed on HBL 116 or on EML 114 if HBL 116 is optionally not included. ETL 118 can be configured to facilitate the transportation of electrons from EIL 120 EML 114. In the absence of HBL 116, ETL 118 can be configured to block holes from escaping EML 114. In some embodiments, ETL 118 can include n-type, organic or inorganic semiconductor materials such as, for example, metal oxides or nanostructures of metal oxides (e.g., zinc oxide (ZnO), zinc magnesium oxide (ZnMgO), or titanium oxide ($TiO_2$)) or benzimidazole derivatives. In some embodiments, ETL 118 can be formed by, for example, spin coating, inkjet printing, slot die coating, nozzle printing, contact printing, a suitable solution printing technology, thermal evaporation, or a suitable vapor deposition technology. In some embodiments, ETL 118 can have a vertical dimension (e.g., thickness) along a Z-axis ranging from about 50 nm to about 100 nm (e.g., about 50 nm, about 60 nm, about 80 nm, or about 100 nm).

Optionally, EIL 120 can be formed on ETL 118 and can be configured to facilitate the injection of electrons from cathode 122 into ETL 118 by forming an ohmic or near ohmic contact with cathode 122. In some embodiments, EIL 120 can include n-type semiconductor materials, alkali metal salts (e.g., lithium fluoride (LiF) or cesium carbonate ($Cs_2CO_3$)), low work function metals (e.g., calcium (Ca), barium (Ba), magnesium (Mg), ytterbium (Yb), or cesium (Cs)), or organic compounds (e.g., polyfluorenes, polyethylenimine ethoxylated (PETE), or lithium-8-hydroxyquinolinolate (Liq)). In some embodiments, ETL 118 and EIL 120 can include material similar or different from each other. EIL 120 can be deposited on ETL 118 by, for example, spin coating, inkjet printing, slot die coating, nozzle printing, contact printing, a suitable solution printing technology, thermal evaporation, or a suitable vapor deposition technology.

Cathode 122 can be formed directly on EIL 120 or on EML 114 if EIL 120, ETL 118, and HBL 116 are optionally not included. Cathode 122 can be configured to inject electrons to device stack 103 when negatively biased during operation, as discussed above. In some embodiments, cathode 122 can have a vertical dimension (e.g., thickness) along a Z-axis ranging from about 100 nm to about 5 µm (e.g., about 250 nm, about 280 nm, about 300 nm, about 500 nm, about 1 µm, or about 5 µm). Cathode 122 can include electrically conductive and optically reflective materials such as, for example, aluminum (Al) or silver (Ag), according to some embodiments. The reflective materials of cathode 122 can help to reflect light towards substrate 102 and prevent light from being emitted through cathode 122. The light that is produced due to the release of photons after the recombination of electrons and holes in EML 114 (discussed above) can travel towards cathode 122 and substrate 102. The reflective materials of cathode 122 helps to redirect these photons towards substrate 102 for emission from EL device 100. In some embodiments, cathode 122 can include optically transparent materials such as, for example, ITO or ultrathin metal films. In some embodiments, cathode 122 and anode 104 can be optically transparent and light 101 can be emitted through both substrate 102 and cathode 122. In some alternate embodiments, cathode 122 can be optically transparent and anode 104 can be optically reflective when device stack 103 is configured to emit light 101 through cathode 122 instead of through substrate 102 as shown in FIG. 1.

In some embodiments, cathode 122 can be formed by depositing and patterning the cathode materials on EIL 120. The deposition can be performed by, for example, sputtering, thermal evaporation, a suitable solution printing technology, or a suitable method for depositing electrically conductive and optically reflective materials. The patterning can be performed, for example, by an ink-jet printing process or by thermally evaporating the cathode material through a mask with desired pattern.

In some embodiments, cathode 122 can be a patterned layer and using a patterned cathode 122 can be another way to generate images on substrate 102 or a display screen (not shown). As only the patterned regions of patterned cathode 122 can provide a current path to anode 104 and produce light 101, the patterned regions of patterned cathode 122 can correspond to the final image pattern displayed by EL device 100. EL device 100 can be formed without patterned insulating layer 106 when patterned cathode 122 is used, according to some embodiments.

Encapsulation layer 124 can be formed directly on cathode 122 and on side surfaces (not shown in FIG. 1) of EL device 100 and can be configured to provide mechanical and environmental protection to EL device 100. In some embodiments, encapsulation layer 124 can include a coupling layer 124A and a barrier film 124B. The materials of coupling layer 124A and barrier film 124B can be selected to have barrier properties to provide mechanical and environmental protection along with flexibility to EL device 100. In some embodiments, the materials of coupling layer 124A and barrier film 124B can have a barrier property, such as a water vapor transmission rate (WVTR) ranging from about $10^{-5}$ g/m$^2$-day to about 10 g/m$^2$-day (e.g., about $10^{-5}$ g/m$^2$-day, about $10^{-4}$ g/m$^2$-day, about $10^{-3}$ g/m$^2$-day, about $10^{-2}$ g/m$^2$-day, or about $10^{-1}$ g/m$^2$-day) to provide protection from moisture. The WVTRs of coupling layer 124A and barrier film 124 can be similar or different from each other. In some embodiments, the materials of coupling layer 124A and barrier film 124B can be optically opaque, transparent, or reflective when device stack 103 is configured to emit light 101 through substrate 102. In some embodiments, the materials of coupling layer 124A and barrier film 124B can be optically transparent when cathode 122 is optically transparent and device stack 103 is configured to emit light 101 through cathode 122.

In some embodiments, coupling layer 124A can include a flexible pressure sensitive adhesive or other suitable flexible adhesive materials configured to couple barrier film 124B to cathode 122. Barrier film 124B can include a metal laminate, a metal foil, decorative colored backing, or other suitable flexible barrier materials, according to some embodiments. Coupling layer 124A and barrier film 124B can be optically transparent, reflective, or opaque. In some embodiments, coupling layer 124A can have a vertical dimension (e.g., thickness) along a Z-axis ranging from about 20 µm to about 30 µm (e.g., about 20 µm, about 25 µm, or about 30 µm). In some embodiments, barrier film 124B can have a vertical dimension (e.g., thickness) along a Z-axis ranging from about 10 µm to about 150 µm (e.g., about 10 µm, about 12 µm, about 75 µm, about 100 µm, about 125 µm, or about 150 µm). In some embodiments, the vertical dimensions of barrier film 124B and substrate 102 along a Z-axis can similar or different from each other. The vertical dimensions of coupling layer 124A and barrier film 124B can be selected to reduce stretching or compression of device stack 103, which could lead to device failure due to cracking or buckling of layers or contacts. The vertical dimensions of encapsulation layer 124 and substrate 102 can be selected such that the tensile and/or compressive forces encountered during bending of flexible EL device 100 can be substantially limited within encapsulation layer 124 and/or substrate 102 and do not extend to the layers of device stack 103 of flexible EL device 100. As such, the layers of device stack 103 can be in a neutral plane during bending of flexible EL device 100. The neutral plane can be defined as a plane that is substantially free of a tensile or compressive force.

In some embodiments, a buffer layer (not shown in FIG. 1) can be deposited between cathode 122 and coupling layer 124A. The buffer layer can include an oxide material and have a WVTR ranging from about $10^{-5}$ g/m$^2$-day to about 10 g/m$^2$-day (e.g., about $10^{-5}$ g/m$^2$-day, about $10^{-4}$ g/m$^2$-day, about $10^{-3}$ g/m$^2$-day, about $10^{-2}$ g/m$^2$-day, or about $10^{-1}$ g/m$^2$-day) to provide additional environmental protection. The buffer layer can have a WVTR similar or different from coupling layer 124A and/or barrier film 124B.

Figure 3:
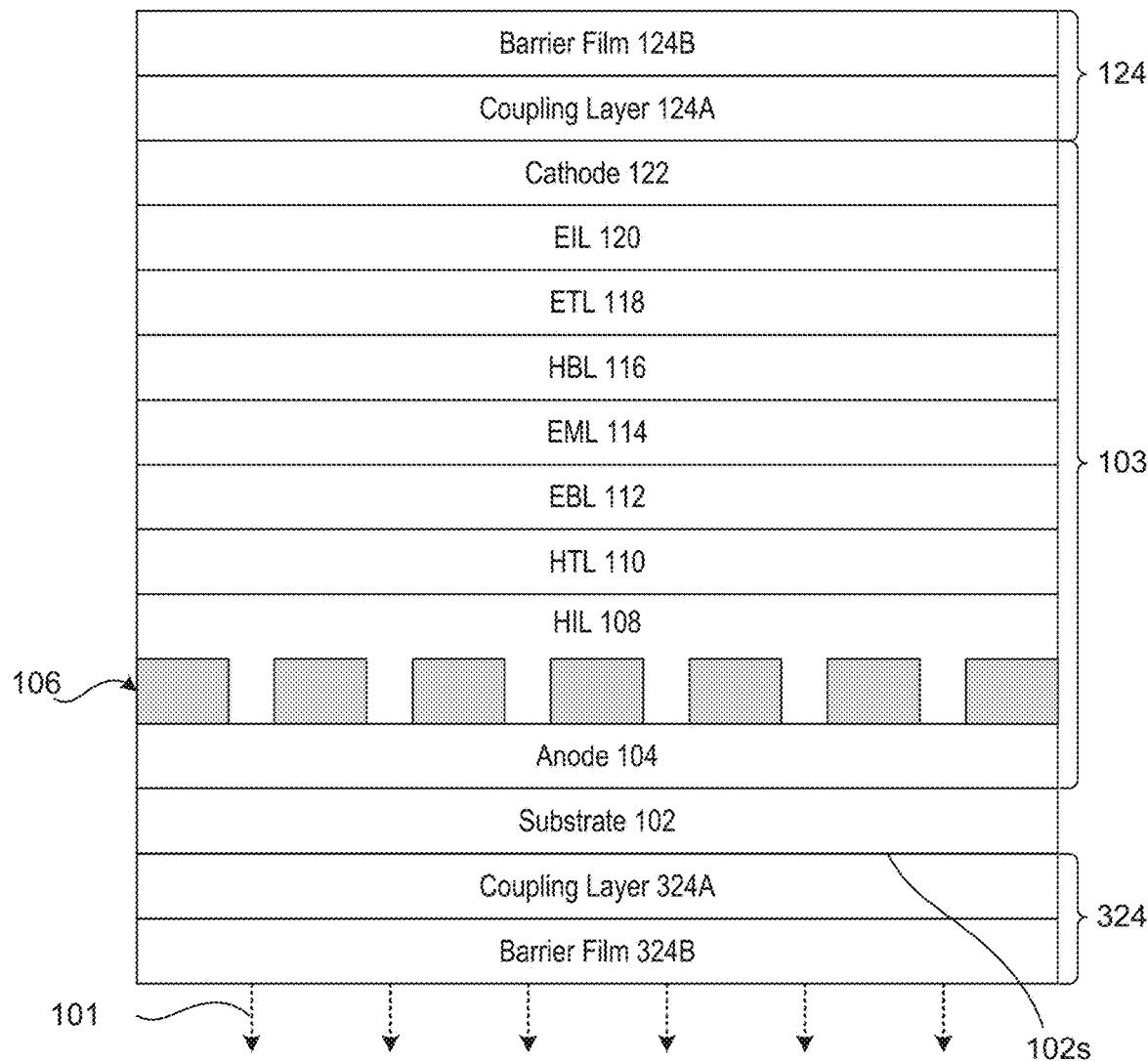
FIG. 3 is a schematic of a cross-sectional view of a flexible EL device with encapsulation layers, according to some embodiment.

FIG. 3 illustrates a schematic of a cross-sectional view of a flexible EL device 300. The discussion of EL device 100 applies to EL device 300 unless mentioned otherwise. EL device 300 can be similar to EL device 100 except EL device 300 includes an encapsulation layer 324 disposed on substrate 102. Encapsulation layer 324 can include coupling layer 324A and barrier film 324B configured to provide mechanical and environmental protection along with flexibility to EL device 100. Coupling layer 324A can be configured to couple barrier film 324B to surface 102s of substrate 102. Coupling 324A and barrier film 324B can be similar to coupling layer 124A and barrier film 124B, respectively, except coupling layer 324A and barrier film 324B can be optically transparent to allow light 101 to be emitted through substrate 102 without substantially absorbing light 101. In some alternate embodiments, coupling layer 324A and barrier film 324B can be optically opaque, transparent, or reflective when anode 104 is optically reflective and device 103 is configured to emit light 101 through cathode 122 instead of through substrate 102 as shown in FIG. 1.

Figure 4:
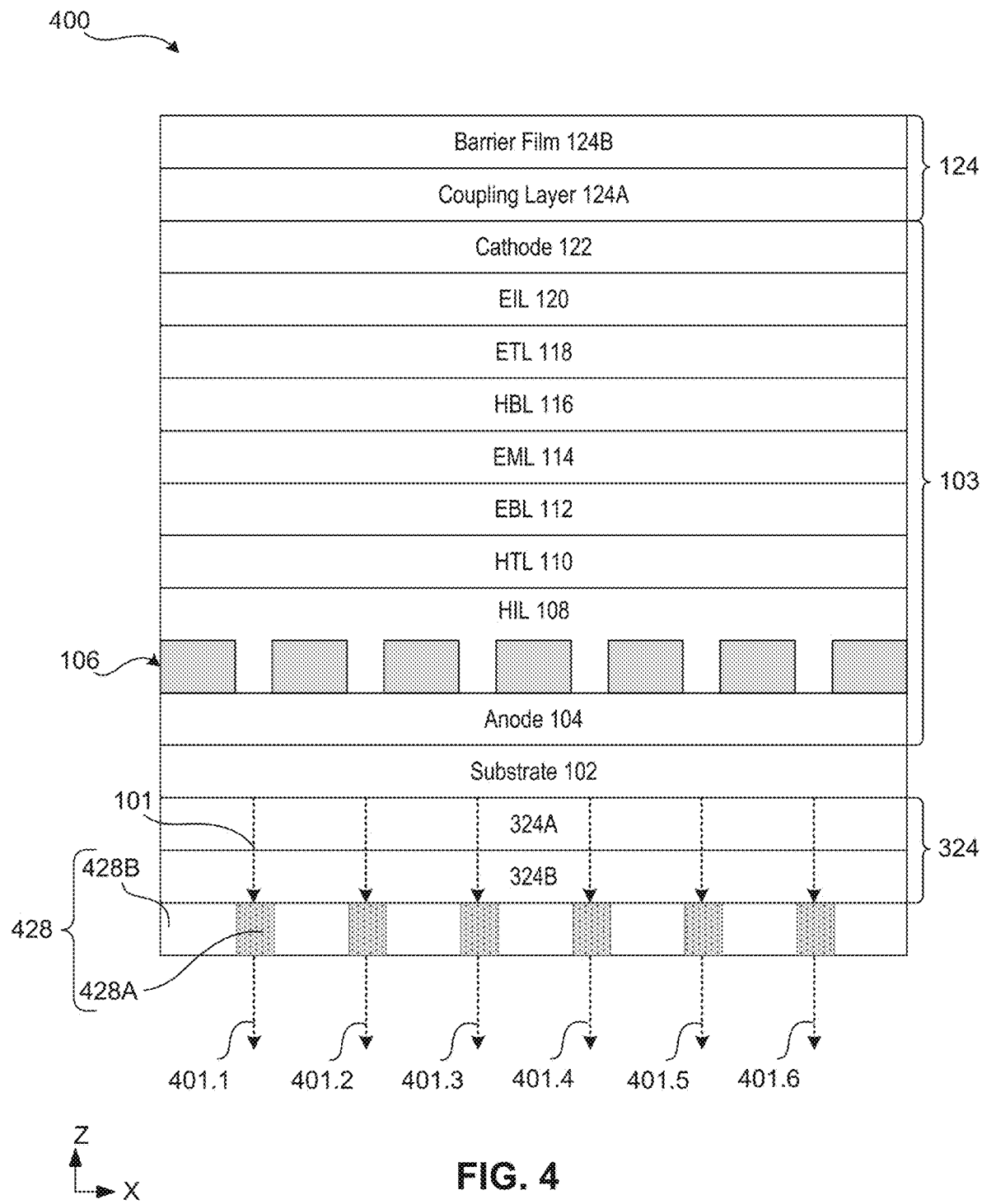
FIG. 4 is a schematic of a cross-sectional view of a flexible EL device with a color processing layer, according to some embodiment.

FIG. 4 illustrates a schematic of a cross-sectional view of a flexible EL device 400. The discussion of EL devices 100 and 300 applies to EL device 400 unless mentioned otherwise. EL device 400 can include a color processing layer 428 disposed on barrier film 324B or on surface 102s of surface 102 if encapsulation layer 324 is optionally not included in EL device 400. Color processing layer 428 can be configured to process light 101 and produce processed light 401.1-401.6. Color of each processed light 401.1-401.6 can be similar or different from each other depending on color processing elements in patterned regions 428A of color processing layer 428.

Color processing layer 428 can include patterned regions 428A and unpatterned regions 428B. Patterned regions 428A can include color processing elements and can be arranged in an array as shown in the top view of color processing layer 428 in FIG. 5. The cross-sectional view of color processing layer 428 in FIG. 4 can be along line A-A of FIG. 5. In some embodiments, patterned regions 428A can be any geometric shape (e.g., circular, triangular, elliptical, or trapezoidal) and is not limited to the rectangular shape shown in FIG. 5. In some embodiments, patterned regions 428A can be arranged in any pattern and is not limited to the arrangement shown in FIG. 5. In some embodiments, patterned regions 106A and 428A can be have similar arrangements.

Color processing elements in patterned regions 428A can include one or more phosphor films (e.g., NS film 800 described with reference to FIG. 8) and/or color filters. The one or more phosphor films can have luminescent nanostructures (NS) such as QDs (e.g., NS 700 described with reference to FIG. 7). In some embodiments, EML 114 can produce blue light 101 and in order to emit processed red or green light through one or more patterned regions 428A, the one or more phosphor films in these one or more patterned regions 428A can produce the processed red or green light by down converting blue light 101. In some embodiments, the one or more phosphor films can include scattering material (e.g., particles having diameters ranging from about 100 nm to about 500 μm) of titanium oxide, zinc oxide, zinc sulfide, silicone, or a combination thereof, with the luminescent nanostructures.

In some embodiments, to emit processed blue light through one or more patterned regions 428A, color processing elements in these one or more patterned regions 428A can include a non-phosphor film having color filtering properties to filter out (e.g., absorb, block, reflect, scatter, or a combination thereof) one or more selective wavelengths or range of wavelengths from blue light 101. This filtering can help to modify (e.g., shift) the primary emission peak wavelength or spectral shape of blue light 101 to a desired wavelength or spectral shape. The non-phosphor film can include dye (e.g., narrow band organic Exciton P491 dye or Exciton ABS430 dye), ink, paint, polymeric material, and/or any material that can be deposited by spraying, painting, spin-coating, printing, transferring or any other suitable deposition method. In some embodiments, the non-phosphor film can include scattering particles (e.g., particles having diameters ranging from about 100 nm to about 500 μm) of titanium oxide, zinc oxide, zinc sulfide, silicone, or a combination thereof.

In some embodiments, color processing layer 428 can be a pre-patterned layer formed by, for example, inkjet printing, nozzle printing, contact printing, or a suitable solution printing technology and can be self-adhesive or can be coupled to barrier film 324B or substrate 102 using a coupling layer similar to coupling layers 124A or 324A.

The elements described in this disclosure as being on or over other elements can be directly on with the other elements or can have intervening layers unless mentioned otherwise. It should be noted that even though some of the elements of FIGS. 1-5 are shown to have similar dimensions along X-, Y-, and/or Z-axes with respect to each other, a person skilled in the art would understand that each of these elements can have dimensions different from each other in one or more directions, without deviating from the scope or spirit of the invention.

Example Methods for Fabricating Flexible Electroluminescent Device

Figure 6A:
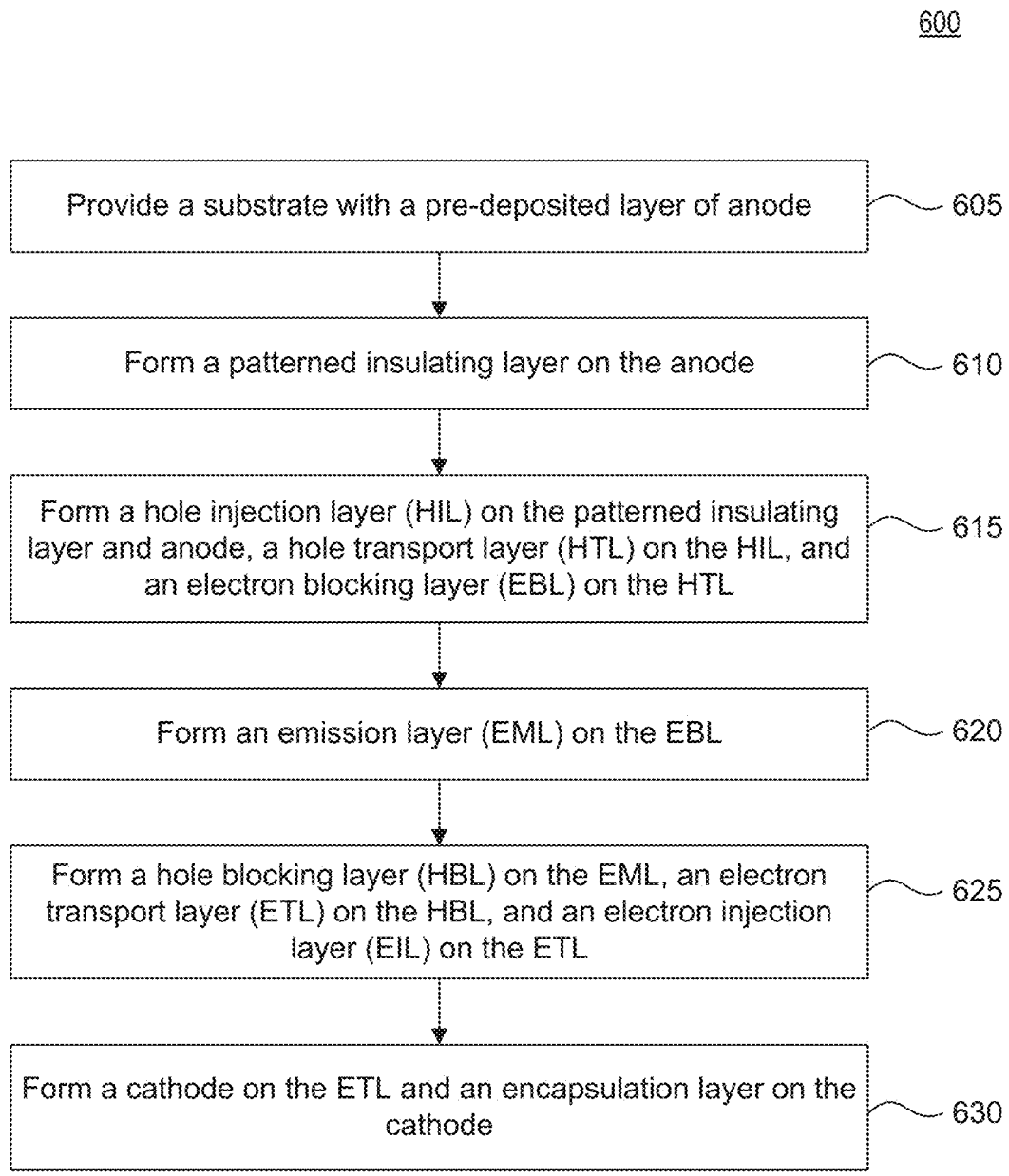
FIG. 6A is a flow diagram of a method for fabricating a flexible EL device with an encapsulation layer, according to some embodiments.

FIG. 6 is a flow diagram of an example method 600 for fabricating flexible EL device 100, according to some embodiments. Steps can be performed in a different order or not performed depending on specific applications. It should be noted that method 600 may not produce a complete EL device 100. Accordingly, it is understood that additional processes can be provided before, during, and after method 600, and that some other processes may only be briefly described herein.

In step 605, a flexible substrate with a pre-deposited layer of anode is provided. For example, as shown in FIG. 1, anode 104 can be disposed on substrate 102. In some embodiments, substrate 102 can be flexible and optically transparent and can include a polymeric material, such as plastic, polyethylene terephthalate (PET), or other suitable flexible polymeric materials. In some embodiments, substrate 102 can include ultrathin silver, silver mesh, silver nanowires, conductive organic polymer, or other suitable conductive materials that does not include indium-tin-oxide (ITO). Anode 104 can include electrically conductive and optically transparent materials such as, for example, indium-tin-oxide (ITO), according to some embodiments. In some embodiments, a PET plastic substrate with pre-deposited ITO layer can be used to as the starting substrate to deposit the other layers of EL device 100 in subsequent processing steps.

In step 610, a patterned insulating layer is formed on the anode. For example, as shown in FIG. 1, patterned insulating layer 106 can be formed on anode 104. In some embodiments, patterned insulating layer 106 can be formed by depositing and patterning the insulating material on anode 104 using inexpensive deposition and/or patterning techniques. The deposition can be performed by, for example, spin coating, inkjet printing, slot die coating, nozzle printing, contact printing, or a suitable solution deposition technology for depositing insulating materials. The patterning can be performed by, for example, a lithography process or a masking process during the deposition. The mask used for lithography can be a low-cost ink-jet printed ink on a transparent film. In some embodiments, the patterning can be performed using laser to form the openings in patterned regions 106A. In some embodiments, half-tone printing technique can be used to form patterned insulating layer 106 on anode 104. In some embodiments, a pre-cut or pre-patterned insulating film with patterned regions 106A can be deposited on anode 104 to form patterned insulating layer 106 in an inexpensive process. The pre-cut insulating film can be self-adhesive and its patterned regions 106A can be formed by die cutting or laser cutting. In some embodiments, the patterning can be performed using offset lithography, gravure printing, or flexographic printing.

In step 615, a hole injection layer (HIL), a hole transport layer (HTL), and an electron block layer (EBL) is formed. For example, as shown in FIG. 1, HIL 108 can be disposed partly on unpatterned regions 108B of patterned insulating layer 106 and partly on portions of anode 104 exposed through patterned regions 106A of patterned insulting layer 106. HTL 110 can be disposed on HIL 108 and EBL 112 can be disposed on HTL 110. HIL 108, HTL 110, and EBL 112 can each be deposited on its underlying layer by, for example, spin coating, inkjet printing, slot die coating, nozzle printing, contact printing, a suitable solution printing technology, roll-to-roll processing, thermal evaporation, or a suitable vapor deposition technology. In some embodiments, HIL 108 can include PEDOT (poly(3,4-ethylenedioxythiophene)) doped with PSS (poly(styrene sulfonate)) and HTL 110 can include TFB (poly[(9,9-dioctylfluorenyl-2,7-diyl)-co-(4,4'(N-(4-sec-butylphenyl))) diphenylamine]).

In step 620, an emission layer (EML) is formed on the EBL. For example, as shown in FIG. 1, EML 114 can be disposed on EBL 112. In some embodiments, EML 114 can be deposited on EBL 112 by, for example, spin coating, inkjet printing, slot die coating, nozzle printing, contact printing, a suitable solution printing technology, thermal evaporation, or a suitable vapor deposition technology. In some embodiments, EML 114 can include indium phosphide (InP) based QDs having a diameter of about 20 nm and configured to emit a primary emission peak wavelength in the red wavelength region. In some embodiments, step 615 can be an optional step and step 610 can be followed by step 620, where the EML is formed on the patterned insulating layer.

In step 625, a hole blocking layer (HBL), an electron transport layer (ETL), and an electron injection layer (EIL) is formed. For example, as shown in FIG. 1, HBL 116 can be disposed on EML 114, ETL 118 can be disposed on HBL 116, and EIL 120 can be disposed on ETL 118. HBL 116, ETL 118, and EIL 120 can each be deposited on its underlying layer by, for example, spin coating, inkjet printing, slot die coating, nozzle printing, contact printing, a suitable solution printing technology, thermal evaporation, or a suitable vapor deposition technology. In some embodiments, ETL 118 can include zinc magnesium oxide (ZnMgO).

In step 630, a cathode is formed on the EIL and an encapsulation layer is formed on the cathode. For example, as shown in FIG. 1, cathode 122 can be disposed on EIL 120 and encapsulation layer 124 can be disposed on cathode 122. Cathode 122 can include electrically conductive and optically reflective materials such as, for example, aluminum (Al) or silver (Ag), according to some embodiments. In some embodiments, cathode 122 can be formed by depositing the cathode materials on EIL 120 by, for example, sputtering, thermal evaporation, a suitable solution printing technology, or a suitable method for depositing electrically conductive and optically reflective materials. In some embodiments, step 625 can be an optional step and step 620 can be followed by step 630, where the cathode is formed on the EML.

Encapsulation layer 124 can be formed directly on cathode 122. In some embodiments, encapsulation layer 124 can include a coupling layer 124A and a barrier film 124B. The materials of coupling layer 124A and barrier film 124B can be selected to have barrier properties, such as a water vapor transmission rate (WVTR) ranging from about $10^{-5}$ g/m$^2$-day to about 10 g/m$^2$-day (e.g., about $10^{-5}$ g/m$^2$-day, about $10^{-4}$ g/m$^2$-day, about $10^{-3}$ g/m$^2$-day, about $10^{-2}$ g/m$^2$-day, or about $10^{-1}$ g/m$^2$-day). The WVTRs of coupling layer 124A and barrier film 124 can be similar or different from each other.

In some embodiments, coupling layer 124A can include a flexible pressure sensitive adhesive (PSA) or other suitable flexible adhesive materials configured to couple barrier film 124B to cathode 122. Coupling layer 124A can be applied on cathode 122 followed by barrier film 124B on coupling layer 124A. Barrier film 124B can include a metal laminate, a metal foil, decorative colored backing, or other suitable flexible barrier materials, according to some embodiments. Coupling layer 124A and barrier film 124B can be optically transparent, reflective, or opaque.

In some embodiments, EL device 100 with encapsulation layer 124 and without insulating layer 106 can be used as light sources in sub-pixels of active matrix display devices. The inexpensive method of encapsulating EL device 100 using encapsulation layer 124 can help reduce manufacturing costs of active matrix display devices.

Figure 6B:
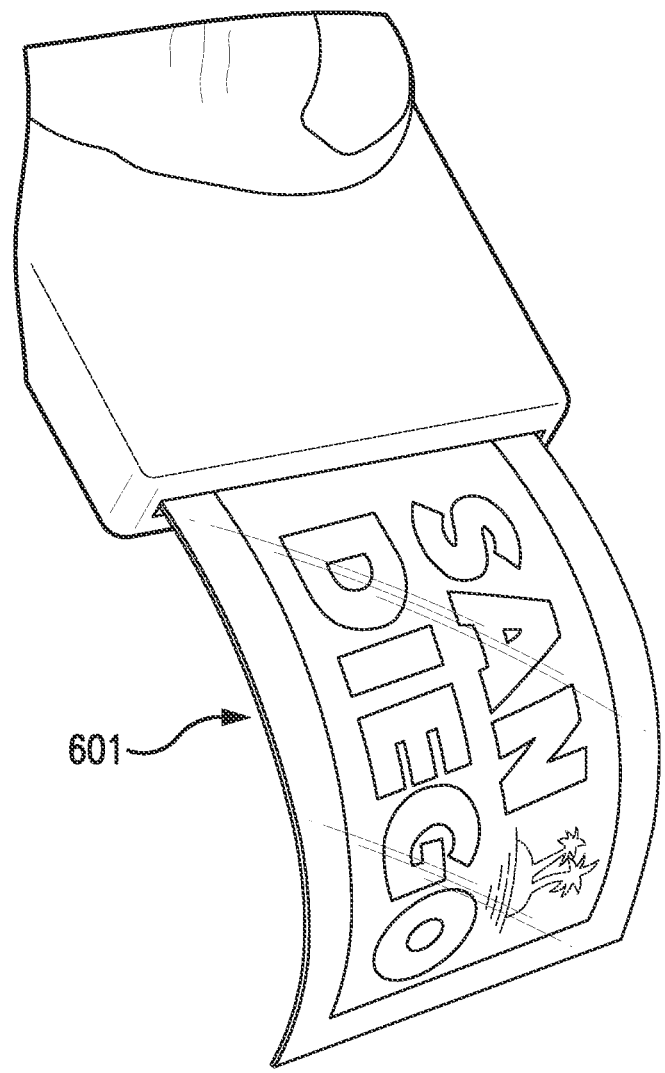
FIG. 6B is an flexible EL device, according to some embodiments.

FIG. 6B shows an example EL device 601 fabricated using example method 600 described with reference to FIG. 6.

Example Embodiments of a Barrier Layer Coated Nanostructure

Figure 7:
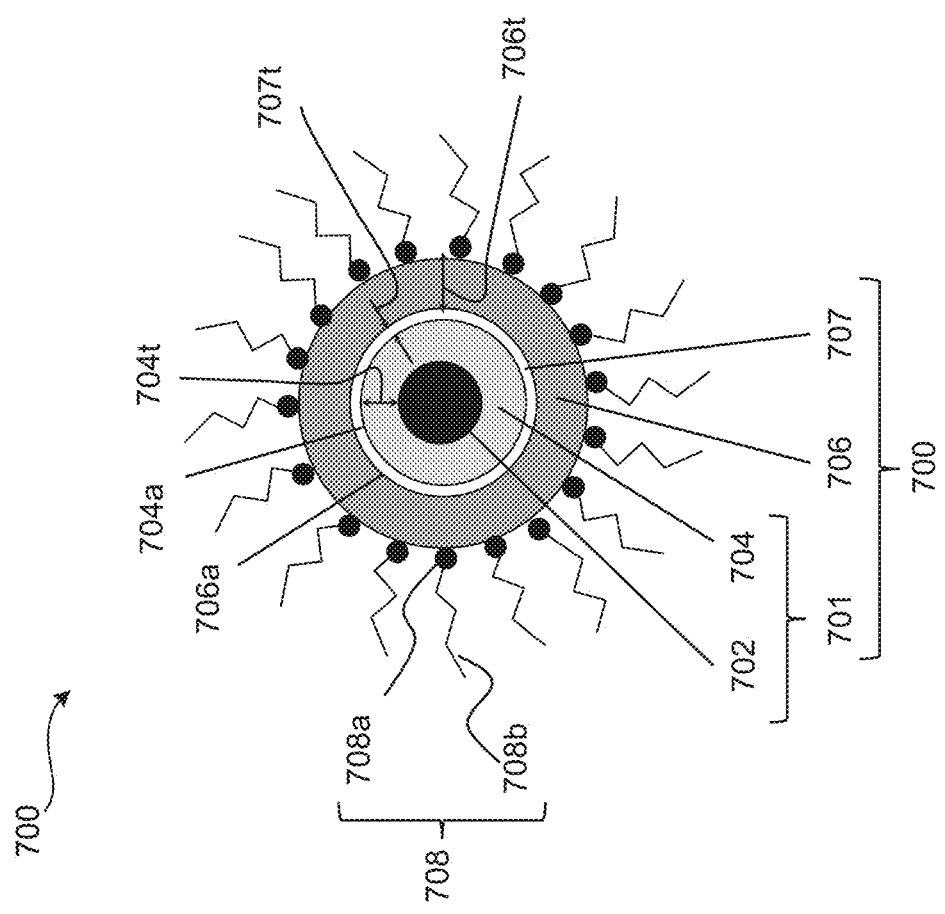
FIG. 7 is a schematic of a cross-sectional view of a nanostructure (NS), according to some embodiments.

FIG. 7 illustrates a cross-sectional structure of a barrier layer coated luminescent nanostructure (NS) 700, according to an embodiment. In some embodiments, a population of NS 700 can be included in light emitting layers of EML 114. Barrier layer coated NS 700 includes a NS 701 and a barrier layer 706. NS 701 includes a core 702 and a shell 704. Core 702 includes a semiconducting material that emits light. Examples of the semiconducting material for core 702 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap can be used as well. In an embodiment, core 702 can also include one or more dopants such as metals, halogens, and alloys, to provide some examples. Examples of metal dopant can include, but not limited to, zinc (Zn), Copper (Cu), aluminum (Al), platinum (Pt), chrome (Cr), tungsten (W), palladium (Pd), or a combination thereof. Examples of a halogen dopant can include, but are not limited to, fluorine (F), chlorine (Cl), bromine (Br) or iodine (I). The presence of one or more dopants in core 702 can improve structural, electrical, and/or optical stability and QY of NS 701 compared to undoped NSs.

Core 702 can have a size of less than 20 nm in diameter, according to an embodiment. In another embodiment, core 702 can have a size between about 1 nm and about 10 nm in diameter. The ability to tailor the size of core 702, and consequently the size of NS 701 in the nanometer range enables photoemission coverage in the entire optical spectrum. In general, the larger NSs emit light towards the red end of the spectrum, while smaller NSs emit light towards the blue end of the spectrum. This effect arises as larger NSs have energy levels that are more closely spaced than the smaller NSs. This allows the NS to absorb photons containing less energy, i.e. those closer to the red end of the spectrum.

Shell 704 surrounds core 702 and is disposed on outer surface of core 702. Shell 704 can include, but is not limited to, cadmium sulfide (CdS), zinc cadmium sulfide (ZnCdS), zinc selenide sulfide (ZnSeS), and zinc sulfide (ZnS). In an embodiment, shell 704 can have a thickness 704t, for example, one or more monolayers. In other embodiments, shell 704 can have a thickness 704t between about 1 nm and about 10 nm. Shell 704 can be utilized to help reduce the lattice mismatch with core 702 and improve the QY of NS 701. Shell 704 can also help to passivate and remove surface trap states, such as dangling bonds, on core 702 to increase QY of NS 701. The presence of surface trap states can provide non-radiative recombination centers and contribute to lowered emission efficiency of NS 701.

In alternate embodiments, NS 701 can include a second shell disposed on shell 704, or more than two shells surrounding core 702, without departing from the spirit and scope of the present invention. In an embodiment, the second shell can be one or more monolayers thick and is typically, though not required, also a semiconducting material. Second shell can provide protection to core 702. Second shell material can be zinc sulfide (ZnS), although other materials can be used, and dopants can be included as well, without deviating from the scope or spirit of the invention.

Barrier layer 706 is configured to form a coating on NS 701. In an embodiment, barrier layer 706 is disposed on and in substantial contact with outer surface 704a of shell 704. In embodiments of NS 701 having one or more shells, barrier layer 706 can be disposed on and in substantial contact with the outermost shell of NS 701. In an example embodiment, barrier layer 706 is configured to act as a spacer between NS 701 and one or more NSs in, for example, a solution, a composition, and/or a film having a plurality of NSs, where the plurality of NSs can be similar to NS 701 and/or barrier layer coated NS 700. In such NS solutions, NS compositions, and/or NS films, barrier layer 706 can help to prevent aggregation of NS 701 with adjacent NSs. Aggregation of NS 701 with adjacent NSs can lead to increase in size of NS 701 and consequent reduction or quenching in the optical emission properties of the aggregated NS (not shown) including NS 701. In further embodiments, barrier layer 706 provides protection to NS 701 from, for example, moisture, air, and/or harsh environments (e.g., high temperatures and chemicals used during lithographic processing of NSs and/or during manufacturing process of NS based devices) that can adversely affect the structural and optical properties of NS 701.

Barrier layer 706 can include one or more materials that are amorphous, optically transparent and/or electrically inactive. Suitable barrier layers include inorganic materials, such as, but not limited to, inorganic oxides, halides, and/or nitrides. Examples of materials for barrier layer 706 include oxides and/or nitrides of Al, Ba, Ca, Mg, Ni, Si, Ti, or Zr, according to various embodiments. Barrier layer 706 can have a thickness 706t ranging from about 0.5 nm to about 15 nm in various embodiments.

Barrier layer coated NS 700 can additionally or optionally include a buffer layer 707 configured to form a buffered coating on NS 701. In an embodiment, buffer layer 107 is disposed on shell 704 and in substantial contact with outer surface 704a of shell 704 and inner surface 706a of barrier layer 706. Buffer layer 107 can be configured to act as a buffer between NS 701 and chemicals used during subsequent processing on NS 701, such as, for example, formation of barrier layer 706 on NS 701.

Buffer layer 707 can help to substantially reduce and/or prevent quenching in the optical emission properties of NS 701 due to reaction with chemicals used during subsequent processing on NS 701. Buffer layer 707 can include one or more materials that are amorphous, optically transparent and/or electrically active. The one or more materials of buffer layer 707 can include inorganic or organic materials. Examples of inorganic materials for buffer layer 707 include oxides and/or nitrides of metals, according to various embodiments. Examples for metal oxides include ZnO, $TiO_2$, $In_2O_3$, $Ga_2O_3$, $SnO_2$, $Al_2O_3$, or MgO. Buffer layer 707 can have a thickness 707t ranging from about 1 nm to about 5 nm in various embodiments.

As illustrated in FIG. 7, barrier layer coated NS 700 can additionally or optionally include a plurality of ligands or surfactants 708, according to an embodiment. Ligands or surfactants 708 can be adsorbed or bound to an outer surface of barrier layer coated NS 700, such as on an outer surface of barrier layer 706, or outer surface of shell 704 or second shell, according to an embodiment. The plurality of ligands or surfactants 708 can include hydrophilic or polar heads 708a and hydrophobic or non-polar tails 708b. The hydrophilic or polar heads 708a can be bound to barrier layer 706. The presence of ligands or surfactants 708 can help to separate NS 700 and/or NS 701 from other NSs in, for example, a solution, a composition, and/or a film during their formation. If the NSs are allowed to aggregate during their formation, the quantum efficiency of NSs such as NS 700 and/or NS 701 can drop. Ligands or surfactants 708 can also be used to impart certain properties to barrier layer coated NS 700, such as hydrophobicity to provide miscibility in non-polar solvents, or to provide reaction sites (e.g., reverse micellar systems) for other compounds to bind.

A wide variety of ligands exist that can be used as ligands 708. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is a thiol, for example, octanethiol. In some embodiments, the ligand is diphenylphosphine. In some embodiments, the ligand is a neutral salt of any of these fatty acids, or a chalcogenide of any of these amines, phosphines, or phosphine oxides, for example, zinc oleate, zinc laurate, TOP-selenide, or TOP-sulfide.

A wide variety of surfactants exist that can be used as surfactants 708. Nonionic surfactants can be used as surfactants 708 in some embodiments. Some examples of nonionic surfactants include polyoxyethylene (5) nonylphenylether (commercial name IGEPAL CO-520), polyoxyethylene (9) nonylphenylether (IGEPAL CO-630), octylphenoxy poly (ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), and polyoxyethylene branched nonylcyclohexyl ether (Triton N-101).

Anionic surfactants can be used as surfactants 708 in some embodiments. Some examples of anionic surfactants include sodium dioctyl sulfosuccinate, sodium stearate, sodium lauryl sulfate, sodium monododecyl phosphate, sodium dodecylbenzenesulfonate, and sodium myristyl sulfate.

In some embodiments, NSs 701 and/or 700 can be synthesized to emit light in one or more various color ranges, such as red, orange, and/or yellow range. In some embodiments, NSs 701 and/or 700 can be synthesized to emit light in the green and/or yellow range. In some embodiments, NSs 701 and/or 700 can be synthesized emit light in the blue, indigo, violet, and/or ultra-violet range. In some embodiments, NSs 701 and/or 700 can be synthesized to have a primary emission peak wavelength between about 605 nm and about 650 nm, between about 510 nm and about 550 nm, or between about 300 nm and about 495 nm.

NSs 701 and/or 700 can be synthesized to display a high QY. In some embodiments, NSs 701 and/or 700 can be synthesized to display a QY between 80% and 100% or between 85% and 90%.

Thus, according to various embodiments, NSs 700 can be synthesized such that the presence of barrier layer 706 on NSs 701 does not substantially change or quench the optical emission properties of NSs 701.

Example Embodiments of a Nanostructure Film

Figure 8:
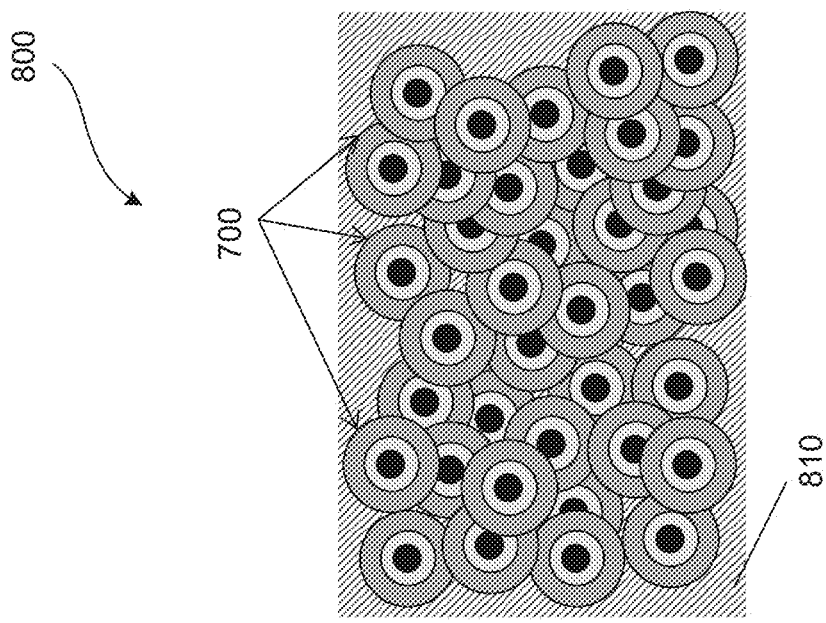
FIG. 8 is a schematic of a NS film, according to some embodiments.

FIG. 8 illustrates a cross-sectional view of a NS film 800, according to an embodiment. In some embodiments, light emitting layers of EML 114 can be similar to NS film 800.

NS film 800 can include a plurality of barrier layer coated core-shell NSs 700 (FIG. 7) and a matrix material 810, according to an embodiment. NSs 700 can be embedded or otherwise disposed in matrix material 810, according to some embodiments. As used herein, the term "embedded" is used to indicate that the NSs are enclosed or encased within matrix material 810. It should be noted that NSs 700 can be uniformly distributed throughout matrix material 810 in an embodiment, though in other embodiments NSs 700 can be distributed according to an application-specific uniformity distribution function. It should be noted that even though NSs 700 are shown to have the same size in diameter, a person skilled in the art would understand that NSs 700 can have a size distribution.

In an embodiment, NSs 700 can include a homogenous population of NSs having sizes that emit in the blue visible wavelength spectrum, in the green visible wavelength spectrum, or in the red visible wavelength spectrum. In other embodiments, NSs 700 can include a first population of NSs having sizes that emit in the blue visible wavelength spectrum, a second population of NSs having sizes that emit in the green visible wavelength spectrum, and a third population of NSs that emit in the red visible wavelength spectrum.

Matrix material 810 can be any suitable host matrix material capable of housing NSs 700. Suitable matrix materials can be chemically and optically compatible with NSs 700 and any surrounding packaging materials or layers used in applying NS film 800 to devices. Suitable matrix materials can include non-yellowing optical materials which are transparent to both the primary and secondary light, thereby allowing for both primary and secondary light to transmit through the matrix material. In an embodiment, matrix material 810 can completely surround each of the NSs 700. The matrix material 810 can be flexible in applications where a flexible or moldable NS film 800 is desired. Alternatively, matrix material 810 can include a high-strength, non-flexible material.

Matrix material 810 can include polymers, other semiconducting nanoparticles, organic and inorganic oxides, or other semiconducting or insulating materials. Suitable polymers for use in matrix material 810 can be any polymer known to the ordinarily skilled artisan that can be used for such a purpose. The polymer can be substantially translucent or substantially transparent. Matrix material 810 can include, but not limited to, epoxies, acrylates, norbornene, polyethylene, poly(vinyl butyral):poly(vinyl acetate), poly-urea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with bifunctional monomers, such as divinylbenzene; cross-linkers suitable for cross-linking ligand materials, epoxides which combine with ligand amines (e.g., APS or PEI ligand amines) to form epoxy, and the like.

In some embodiments, matrix material 810 includes scattering microbeads such as $TiO_2$ microbeads, ZnS microbeads, or glass microbeads that can improve photo conversion efficiency of NS film 800. In some embodiments, matrix material 810 can include conductive or semiconductive materials.

In another embodiment, matrix material 810 can have low oxygen and moisture permeability, exhibit high photo- and chemical-stability, exhibit favorable refractive indices, and adhere to outer surfaces of NSs 700, thus providing an air-tight seal to protect NSs 700. In another embodiment, matrix material 810 can be curable with UV or thermal curing methods to facilitate roll-to-roll processing.

According to some embodiments, NS film 800 can be formed by mixing NSs 700 in a polymer (e.g., photoresist) and casting the NS-polymer mixture on a substrate, mixing NSs 700 with monomers and polymerizing them together, mixing NSs 700 in a sol-gel to form an oxide, or any other method known to those skilled in the art.

Example Embodiments of Luminescent Nanostructures

Described herein are various compositions having luminescent nanostructures (NSs). The various properties of the luminescent nanostructures, including their absorption properties, emission properties and refractive index properties, can be tailored and adjusted for various applications.

The material properties of NSs can be substantially homogenous, or in certain embodiments, can be heterogeneous. The optical properties of NSs can be determined by their particle size, chemical or surface composition. The ability to tailor the luminescent NS size in the range between about 1 nm and about 20 nm can enable photoemission coverage in the entire optical spectrum to offer great versatility in color rendering. Particle encapsulation can offer robustness against chemical and UV deteriorating agents.

Luminescent NSs, for use in embodiments described herein can be produced using any method known to those skilled in the art. Suitable methods and example nanocrystals are disclosed in U.S. Pat. No. 7,374,807; U.S. patent application Ser. No. 10/796,832, filed Mar. 10, 2004; U.S. Pat. No. 6,949,206; and U.S. Provisional Patent Application No. 60/578,236, filed Jun. 8, 2004, the disclosures of each of which are incorporated by reference herein in their entireties.

Luminescent NSs for use in embodiments described herein can be produced from any suitable material, including an inorganic material, and more suitably an inorganic conductive or semiconductive material. Suitable semiconductor materials can include those disclosed in U.S. patent application Ser. No. 10/796,832, and can include any type of semiconductor, including group II-VI, group III-V, group IV-VI, group and group IV semiconductors. Suitable semiconductor materials can include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SuS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, CuInGaS, CuInGaSe, and an appropriate combination of two or more such semiconductors.

In certain embodiments, the luminescent NSs can have a dopant from the group consisting of a p-type dopant or an n-type dopant. The NSs can also have II-VI or III-V semiconductors. Examples of II-VI or III-V semiconductor NSs can include any combination of an element from Group II, such as Zn, Cd and Hg, with any element from Group VI, such as S, Se, Te and Po, of the Periodic Table; and any combination of an element from Group III, such as B, Al, Ga, In, and Tl, with any element from Group V, such as N, P, As, Sb and Bi, of the Periodic Table.

The luminescent NSs, described herein can also further include ligands conjugated, cooperated, associated or attached to their surface. Suitable ligands can include any group known to those skilled in the art, including those disclosed in U.S. Pat. No. 8,283,412; U.S. Patent Publication No. 2008/0237540; U.S. Patent Publication No. 2010/0110728; U.S. Pat. Nos. 8,563,133; 7,645,397; 7,374,807; 6,949,206; 7,572,393; and 7,267,875, the disclosures of each of which are incorporated herein by reference. Use of such ligands can enhance the ability of the luminescent NSs to incorporate into various solvents and matrixes, including polymers. Increasing the miscibility (i.e., the ability to be mixed without separation) of the luminescent NSs in various solvents and matrixes can allow them to be distributed throughout a polymeric composition such that the NSs do not aggregate together and therefore do not scatter light. Such ligands are described as "miscibility-enhancing" ligands herein.

In certain embodiments, compositions having luminescent NSs distributed or embedded in a matrix material are provided. Suitable matrix materials can be any material known to the ordinarily skilled artisan, including polymeric materials, organic and inorganic oxides. Compositions described herein can be layers, encapsulants, coatings, sheets or films. It should be understood that in embodiments described herein where reference is made to a layer, polymeric layer, matrix, sheet or film, these terms are used interchangeably, and the embodiment so described is not limited to any one type of composition, but encompasses any matrix material or layer described herein or known in the art.

Down-converting NSs (for example, as disclosed in U.S. Pat. No. 7,374,807) utilize the emission properties of luminescent nanostructures that are tailored to absorb light of a particular wavelength and then emit at a second wavelength, thereby providing enhanced performance and efficiency of active sources (e.g., LEDs).

While any method known to the ordinarily skilled artisan can be used to create luminescent NSs, a solution-phase colloidal method for controlled growth of inorganic nanomaterial phosphors can be used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," J. Am. Chem. Soc. 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," J Am. Chem. Soc. 115:8706 (1993), the disclosures of which are incorporated by reference herein in their entireties.

According to an embodiment, CdSe can be used as the NS material, in one example, for visible light down-conversion, due to the relative maturity of the synthesis of this material. Due to the use of a generic surface chemistry, it can also possible to substitute non-cadmium-containing NSs.

In semiconductor NSs, photo-induced emission arises from the band edge states of the NS. The band-edge emission from luminescent NSs competes with radiative and non-radiative decay channels originating from surface electronic states. X. Peng, et al., J Am. Chem. Soc. 30:7019-7029 (1997). As a result, the presence of surface defects such as dangling bonds provide non-radiative recombination centers and contribute to lowered emission efficiency. An efficient and permanent method to passivate and remove the surface trap states can be to epitaxially grow an inorganic shell material on the surface of the NS. X. Peng, et al., J. Am. Chem. Soc. 30:701 9-7029 (1997). The shell material can be chosen such that the electronic levels are type 1 with respect to the core material (e.g., with a larger bandgap to provide a potential step localizing the electron and hole to the core). As a result, the probability of non-radiative recombination can be reduced.

Core-shell structures can be obtained by adding organometallic precursors containing the shell materials to a reaction mixture containing the core NSs. In this case, rather than a nucleation event followed by growth, the cores act as the nuclei, and the shells can grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and to ensure solubility. A uniform and epitaxially grown shell can be obtained when there is a low lattice mismatch between the two materials.

Example materials for preparing core-shell luminescent NSs can include, but are not limited to, Si, Ge, Sn, Se, Te, B, C (including diamond), P, Co, Au, BN, BP, BAs, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTc, BeS, BcSe, BcTe, MgS, MgSe, GeS, GeSe, GeTe, SnS, SnSe, SnTe, PbO, PbS, Pb Se, PbTe, CuP, CuCl, CuBr, CuI, $Si_3N_4$, $Ge_3N_4$, $Al_2O_3$, $(Al, Ga, In)_2 (S, Se, Te)_3$, AlCO, and shell luminescent NSs for use in the practice of the present invention include, but are not limited to, (represented as Core/Shell), CdSe/ZnS, InP/ZnS, InP/ZnSe, PbSe/PbS, CdSe/CdS, CdTe/CdS, CdTe/ZnS, as well as others.

Luminescent NSs for use in the embodiments described herein can be less than about 100 nm in size, and down to less than about 1 nm in size and absorb visible light. As used herein, visible light is electromagnetic radiation with wavelengths between about 380 and about 780 nanometers that is visible to the human eye. Visible light can be separated into the various colors of the spectrum, such as red, orange, yellow, green, blue, indigo and violet. Blue light can comprise light between about 435 nm and about 495 nm, green light can comprise light between about 495 nm and 570 nm and red light can comprise light between about 620 nm and about 750 nm in wavelength.

According to various embodiments, the luminescent NSs can have a size and a composition such that they absorb photons that are in the ultraviolet, near-infrared, and/or infrared spectra. The ultraviolet spectrum can comprise light between about 100 nm to about 400 nm, the near-infrared spectrum can comprise light between about 750 nm to about 100 µm in wavelength, and the infrared spectrum can comprise light between about 750 nm to about 300 µm in wavelength.

While luminescent NSs of other suitable material can be used in the various embodiments described herein, in certain embodiments, the NSs can be ZnSe, ZnTe, ZnS, InAs, InP, CdSe, or any combination thereof to form a population of nanocrystals for use in the embodiments described herein. As discussed above, in further embodiments, the luminescent NSs can be core/shell nanocrystals, such as CdSe/ZnS, InP/ZnSe, CdSe/CdS or InP/ZnS.

Suitable luminescent nanostructures, methods of preparing luminescent nanostructures, including the addition of various solubility-enhancing ligands, can be found in Published U.S. Patent Publication No. 2012/0113672, the disclosure of which is incorporated by reference herein in its entirety.

It is to be understood that while certain embodiments have been illustrated and described herein, the claims are not to be limited to the specific forms or arrangement of parts described and shown. In the specification, there have been disclosed illustrative embodiments and, although specific terms are employed, they are used in a generic and descriptive sense only and not for purposes of limitation. Modifications and variations of the embodiments are possible in light of the above teachings. It is therefore to be understood that the embodiments can be practiced otherwise than as specifically described.

What is claimed is:

1. An electroluminescent (EL) device comprising:
   a device stack comprising:
      an anode and a cathode;
      a quantum dot (QD) film positioned between the anode and the cathode and configured to produce light having a first peak wavelength, and
      a patterned insulating layer disposed on the anode and configured to form electrically active regions in the device stack and to control emission of the light from the EL device through the electrically active regions;
   a flexible substrate configured to support the device stack; and
   an encapsulation layer disposed on the cathode.

2. The EL device of claim 1, wherein the patterned insulating layer comprises patterned and unpatterned regions and wherein the patterned regions are configured to form the electrically active regions.

3. The EL device of claim 1, wherein the patterned insulating layer is configured to emit the light through selective regions of the flexible substrate; and
   wherein the selective regions correspond to patterned regions of the patterned insulating layer.

4. The EL device of claim 1, wherein the QD film comprises a population of QDs configured to emit red, green, or blue light.

5. The EL device of claim 1, wherein the encapsulation layer comprises a coupling layer and a barrier film; and
   wherein the coupling layer includes a pressure sensitive adhesive layer and is configured to attach the barrier film to the cathode.

6. The EL device of claim 1, further comprising a second encapsulation layer disposed on the flexible substrate.

7. The EL device of claim 6, further comprising a color processing layer disposed on the second encapsulation layer and configured to filter or down convert the light to produce a processed light having a second peak wavelength different from the first peak wavelength.

8. The EL device of claim 1, further comprising a color processing layer disposed on the flexible substrate and configured to filter or down convert the light to produce a processed light having a second peak wavelength different from the first peak wavelength.

9. The EL device of claim 8, wherein the color processing layer comprises patterned and unpatterned regions;
   wherein the patterned regions of the color processing layer are configured to filter or down convert the light to produce the processed light; and
   wherein the patterned regions of the color processing layer are arranged in a pattern similar to patterned regions of the patterned insulating layer.

10. An electroluminescent (EL) device comprising:
    a flexible substrate;
    a device stack disposed on the flexible substrate, the device stack comprising:
       an insulating layer disposed on the flexible substrate and patterned to form electrically active regions and to control emission of the light from the EL device through the electrically active regions; and
       a quantum dot (QD) film disposed on the insulating layer and in the electrically active regions, and configured to produce light having a first peak wavelength; and
    an encapsulation layer disposed on the device stack.

11. The EL device of claim 10, wherein the insulating layer comprises patterned and unpatterned regions, and wherein the patterned regions are configured to form the electrically active regions.

12. The EL device of claim 10, wherein the insulating layer is configured to emit the light through selective regions of the flexible substrate; and
    wherein the selective regions correspond to the electrically active regions.

13. The EL device of claim 10, wherein the QD film comprises a population of QDs configured to emit red, green, or blue light.

14. The EL device of claim 10, wherein the encapsulation layer comprises a coupling layer and a barrier film; and
    wherein the coupling layer includes a pressure sensitive adhesive layer and is configured to attach the barrier film to an electrode.

15. The EL device of claim 10, wherein the encapsulation layer comprises a pressure sensitive adhesive layer comprising a water vapor transmission rate (WVTR) ranging from about $10^{-5}$ g/m$^2$-day to about 10 g/m$^2$-day.

16. The EL device of claim 10, wherein the encapsulation layer comprises a barrier film comprising a metal laminate or a metal foil.

17. The EL device of claim 10, wherein the encapsulation layer comprises a barrier film comprising an optically transparent, reflective, or opaque material.

18. The EL device of claim 10, wherein the encapsulation layer comprises a coupling layer and a barrier film; and
    wherein the coupling layer and barrier film comprise flexible materials.

19. The EL device of claim 10, further comprising a second encapsulation layer disposed on the flexible substrate.

20. The EL device of claim 19, further comprising a color processing layer disposed on the second encapsulation layer and configured to filter or down convert the light to produce a processed light having a second peak wavelength different from the first peak wavelength.

\* \* \* \* \*